United States Patent
Soetemans (10) Patent No.: US 7,526,702 B2
(45) Date of Patent: Apr. 28, 2009

(54) METHOD AND SYSTEM FOR TESTING A RANDOM ACCESS MEMORY (RAM) DEVICE HAVING AN INTERNAL CACHE

(75) Inventor: Joseph Soetemans, Carp (CA)

(73) Assignee: Alcatel Lucent, Paris (FR)

( * ) Notice: Subject to any disclaimer, the term of this patent is extended or adjusted under 35 U.S.C. 154(b) by 510 days.

(21) Appl. No.: 11/362,348

(22) Filed: Feb. 27, 2006

(65) Prior Publication Data

US 2007/0204189 A1    Aug. 30, 2007

(51) Int. Cl.
G06F 11/00 (2006.01)
G06F 13/00 (2006.01)
G06F 13/28 (2006.01)
G06F 7/02 (2006.01)
G11C 29/00 (2006.01)

(52) U.S. Cl. .............. 714/735; 711/140; 714/718; 714/819

(58) Field of Classification Search .............. None
See application file for complete search history.

(56) References Cited

U.S. PATENT DOCUMENTS

| | | | | |
|---|---|---|---|---|
| 4,797,813 A * | 1/1989 | Igarashi | .............. | 711/118 |
| 5,226,009 A * | 7/1993 | Arimoto | .............. | 365/189.04 |
| 7,334,159 B1 * | 2/2008 | Callaghan | .............. | 714/30 |

\* cited by examiner

*Primary Examiner*—Christine T Tu (57) ABSTRACT

A method for testing an internal bus of a random access memory ("RAM") device, the RAM device having an internal cache coupled to a memory array by the internal bus, the method comprising: writing a value to an address in the RAM device, the value being stored in the internal cache, the value corresponding to at least one line of an external bus; writing a number of additional values to addresses in the RAM device other than the address to push the value from the internal cache into the memory array; reading a value from the address; and, determining whether the internal bus is faulty by comparing the value written to the value read.

20 Claims, 3 Drawing Sheets

METHOD AND SYSTEM FOR TESTING A RANDOM ACCESS MEMORY (RAM) DEVICE HAVING AN INTERNAL CACHE

FIELD OF THE INVENTION

This invention relates to the field of random access memory ("RAM") testing, and more specifically, to a method and system for testing a RAM device having an internal cache.

BACKGROUND OF THE INVENTION

Random access memory ("RAM") is the place in a computer where the operating system, application programs, and data in current use are kept so that they can be quickly reached by the computer's processor. RAM is much faster to read from and write to than the other kinds of storage in a computer such as the hard disk, a floppy disk, or a compact disk read only memory ("CD-ROM"). However, the data in RAM stays there only as long as the computer is running. When the computer is turned off, RAM loses its data. When the computer is turned on again, the operating system and other files are once again loaded into RAM, usually from the hard disk.

Typically, RAM is packaged in discrete microchip devices that plug into sockets in the computer's motherboard or memory boards. These sockets connect through a bus or set of electrical paths to the processor. The amount of RAM used in current computers systems may be in the gigabytes and is constantly increasing. Having more RAM in a computer reduces the number of times that the computer processor has to read data in from the hard disk, an operation that takes much longer than reading data from RAM. (RAM access time is expressed in nanoseconds; hard disk access time is expressed in milliseconds.)

RAM is called "random access" because any storage location can be accessed directly. Internally, RAM is organized and controlled in a way that enables data to be stored and retrieved directly to specific locations. In general, RAM is much like an arrangement of post-office boxes in which each box can hold a 0 or a 1. Each box has a unique address that can be found by counting across columns and then counting down by row. In RAM, this set of post-office boxes is known as an array and each box is a "cell". To find the contents of a box (cell), the RAM controller sends the column/row address down a very thin electrical line etched into the chip. There is an address line for each row and each column in the set of boxes. If data is being read, the bits that are read flow back on a separate data line. In describing a RAM chip or module, a notation such as 256K×16 means 256 thousand columns of cells standing 16 rows deep. In the most common form of RAM, dynamic RAM ("DRAM"), each cell has a charge or lack of charge held in something similar to an electrical capacitor. A transistor acts as a gate in determining whether the value in the capacitor can be read or written. In static RAM ("SRAM"), instead of a capacitor-held charge, the transistor itself is a positional flip/flop switch, with one position meaning 1 and the other position meaning 0.

When the processor or CPU gets the next instruction it is to perform, the instruction may contain the address of some memory or RAM location from which data is to be read (i.e., brought to the processor for further processing). This address is sent to the RAM controller. The RAM controller organizes the request and sends it down the appropriate address lines so that transistors along the lines open up the cells so that each capacitor value can be read. A capacitor with a charge over a certain voltage level represents the binary value of 1 and a capacitor with less than that charge represents a 0. For DRAM, before a capacitor is read, it must be power-refreshed to ensure that the value read is valid. Generally, the entire line of data is read that the specific address happens to be located at. The data that is read is transmitted along the data lines to the processor's nearby data buffer known as a level-1 cache and another copy may be held in a level-2 cache.

The amount of time that RAM takes to write data or to read it once the request has been received from the processor is called the access time. Typical access times vary from 9 nanoseconds to 70 nanoseconds, depending on the kind of RAM. Although fewer nanoseconds is better, user-perceived performance is based on coordinating access times with the computer's clock cycles. Access time consists of latency and transfer time. Latency is the time to coordinate signal timing and refresh data after reading it.

The main RAM in a computer typically consists of SRAM and DRAM. As mentioned above, DRAM uses a kind of capacitor that needs frequent power refreshing to retain its charge. Because reading a DRAM discharges its contents, a power refresh is required after each read. Apart from reading, just to maintain the charge that holds its content in place, DRAM must be refreshed about every 15 microseconds. DRAM is the least expensive kind of RAM. SRAM is RAM that retains data bits in its memory as long as power is being supplied. Unlike DRAM, which stores bits in cells consisting of a capacitor and a transistor, SRAM does not have to be periodically refreshed. SRAM provides faster access to data and is more generally more expensive than DRAM. SRAM is typically used for a computer's level-1 and level-2 caches which the microprocessor looks in first before looking in DRAM.

Cache memory is RAM that a computer's microprocessor can access more quickly than it can access regular RAM. As the microprocessor processes data, it looks first in the cache memory and if it finds the data there (i.e., from a previous reading of data), it does not have to do the more time-consuming reading of data from larger memory. Cache memory is sometimes described in levels of closeness and accessibility to the microprocessor. Thus, a level-1 cache is on the same chip as the microprocessor while a level-2 cache is usually a separate SRAM chip. The main RAM is usually a DRAM chip.

There are, of course, may other types of RAM. For example, burst static RAM ("BSRAM") is synchronized with the system clock or, in some cases, the cache bus clock. This allows it be more easily synchronized with any device that accesses it and reduces access waiting time. It is often used as external level-2 cache memory in microprocessor chipsets. Enhanced DRAM ("EDRAM") is the combination of SRAM and DRAM in a single package that is usually used for a level-2 cache. Typically, 256 bytes of SRAM is included along with the DRAM. Data is read first from the faster (typically 15 nanoseconds) SRAM and if it is not found there, it is read from the DRAM, typically at 35 nanoseconds. Non-volatile RAM ("NVRAM") is a special kind of RAM that retains data when the computer is turned off or there is a power failure. Like the computer's read-only memory ("ROM"), it is powered by a battery within the computer. It can also work by writing its contents to and restoring them from an electrically erasable programmable read-only memory ("EEPROM"). Synchronous DRAM ("SDRAM") is a generic name for various kinds of DRAM that are synchronized with the clock speed that the microprocessor is optimized for. This tends to increase the number of instructions that the processor can perform in a given time. The speed of SDRAM is rated in MHz rather than in nanoseconds (ns).

This makes it easier to compare the bus speed and the RAM chip speed. Double data rate SDRAM ("DDR SDRAM") can theoretically improve RAM speed to at least 200 MHz. It activates output on both the rising and falling edge of the system clock rather than on just the rising edge, potentially doubling output. And, enhanced SDRAM ("ESDRAM") includes a small SRAM in the SDRAM chip. This means that many accesses will be from the faster SRAM. In case the SRAM doesn't have the data, there is a wide bus between the SRAM and the SDRAM because they are on the same chip. Note that EDRAM and ESDRAM also known as "cached DRAM".

Thus, RAM is one of the key components of any computer system. Accordingly, its proper functioning is critical to computer performance. As such, RAM must be properly and effectively tested. However, RAM devices are becoming increasingly complicated which makes their testing both more difficult and more important. This is especially so for RAM devices that include an internal cache (such as EDRAM and ESDRAM).

One problem with current methods of testing RAM is that internal caching within the RAM device may not be properly accounted for. As such, these current methods may yield false results. In particular, such tests may only access the internal cache section of the RAM device rather than the main memory section.

A need therefore exists for an improved method and system for testing a RAM device having an internal cache. Accordingly, a solution that addresses, at least in part, the above and other shortcomings is desired.

SUMMARY OF THE INVENTION

According to one aspect of the invention, there is provided a method for testing an internal bus of a random access memory ("RAM") device, the RAM device having an internal cache coupled to a memory array by the internal bus, the method comprising: writing a value to an address in the RAM device, the value being stored in the internal cache, the value corresponding to at least one line of an external bus; writing a number of additional values to addresses in the RAM device other than the address to push the value from the internal cache into the memory array; reading a value from the address; and, determining whether the internal bus is faulty by comparing the value written to the value read.

The method may further include repeating the writing of the value for each line of the external bus. The external bus may be a data bus and the value written to the address may be equal to binary 1, and may be incremented by a left shift for each line of the data bus, for determining whether lines of the data bus are at least one of stuck high, stuck low, and shorted. The external bus may be an address bus and the value written to the address may be a pattern for determining whether lines of the address bus are at least one of stuck high, stuck low, and shorted. The value written to the address may be an antipattern being the inverse of the pattern. The number of additional values may correspond to a size of the internal cache. The RAM device may be a dynamic RAM ("DRAM") device. The RAM device may be a static RAM ("SRAM") device. The cache may be a SRAM device and the memory array may be a DRAM device. And, the RAM device may be installed in a printed circuit board ("PCB").

In accordance with further aspects of the present invention there is provided an apparatus such as a data processing system, a method for adapting this system, as well as articles of manufacture such as a computer readable medium having program instructions recorded thereon for practising the method of the invention.

BRIEF DESCRIPTION OF THE DRAWINGS

Features and advantages of the embodiments of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENTS

In the following description, details are set forth to provide an understanding of the invention. In some instances, certain software, circuits, structures and techniques have not been described or shown in detail in order not to obscure the invention. The term "data processing system" is used herein to refer to any machine for processing data, including the computer and test systems described herein. The present invention may be implemented in any computer programming language provided that the operating system of the data processing system provides the facilities that may support the requirements of the present invention. Any limitations presented would be a result of a particular type of operating system or computer programming language and would not be a limitation of the present invention.

Figure 1:
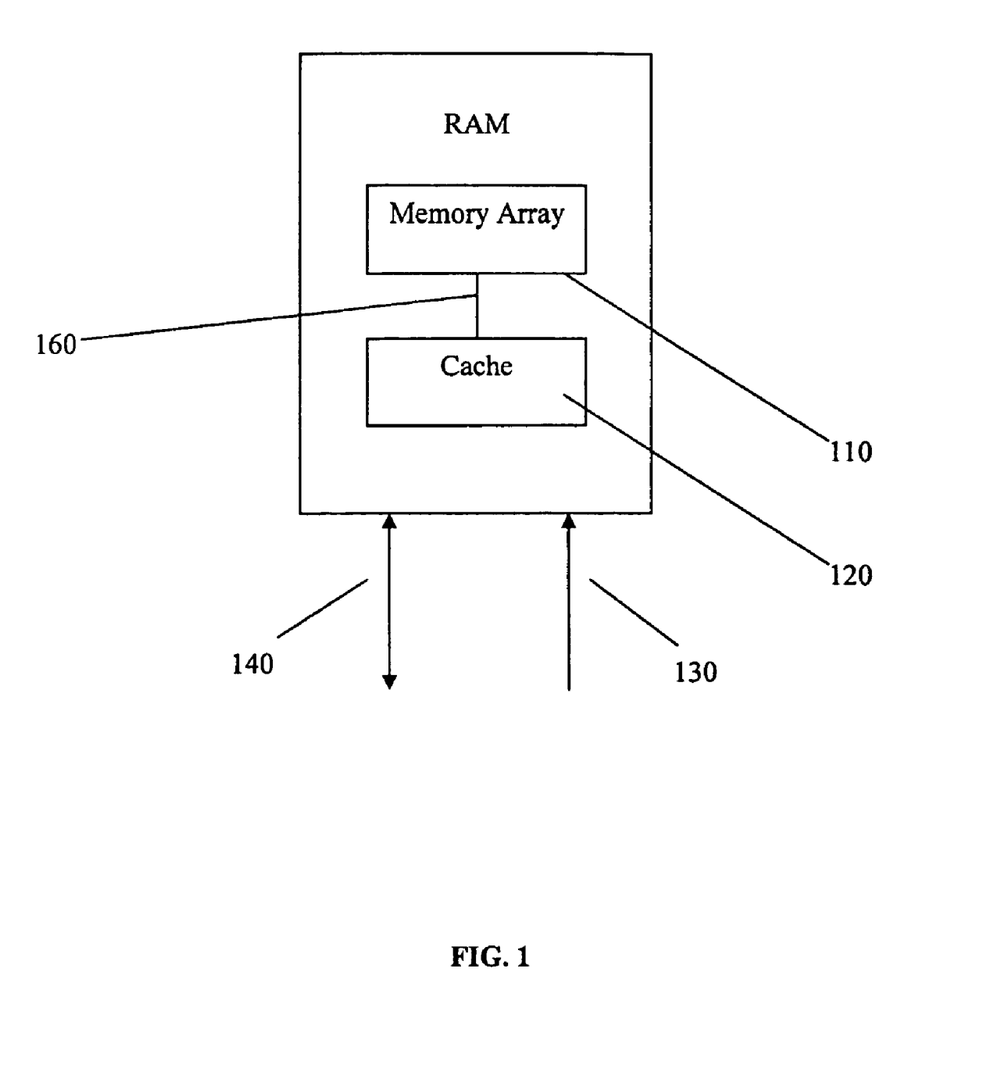
FIG. 1 is a block diagram illustrating a random access memory ("RAM") device adapted to implement an embodiment of the invention.

FIG. 1 is a block diagram illustrating a random access memory ("RAM") device 100 adapted to implement an embodiment of the invention. The RAM device 100 includes a memory array 110 coupled to a cache 120 by an internal bus 160. In addition, the RAM device 100 includes an address bus 130 and a data bus 140. The address bus 130 and data bus 140 may be considered to be external or externally accessible buses. In such a device, when an address is presented on the address bus 130 and a write operation is selected, data presented on the data bus 140 will be stored in the memory array 110 and/or cache 120 for that address. When an address is presented on the address bus 130 and a read operation is selected, data stored in the memory array 110 and/or cache 120 for that address will be presented on the data bus 140. The RAM device 100 may be a SRAM such as the Samsung Model Number K71323682M.

A RAM device 100 having a internal cache 120 such as the one shown in FIG. 1 may operate as follows:

1. The first write to the device 100 at any address (e.g., Address X) is stored within a cache portion 120 of the device, not within the actual memory cell 110 for the address. Any read or write from/to Address X at this point uses the cache 120 only.
2. A second write to the device 100 at a different address (e.g., Address Y) is also stored in the cache portion 120 of the device 100. Any reads or writes to Addresses X and Y at this point will only use the cache portion 120 of the RAM 100. In the this example, the RAM device 100 has a cache size of 2.

3. A third write to the device 100 at a different address (e.g., Address Z) now occurs. The cache portion 120 of the device 100 has been filled so the oldest data is now pushed out into the memory cell 110 for the address (i.e., the data for Address X is pushed into the Address X memory cell) and Address Z takes its place in the cache portion 120 of the RAM 100. Any access to Addresses Y and Z will use the cache portion 120 and any reads from Address X will now retrieve the data from the memory cell 110 within the RAM 100.

Figure 2:
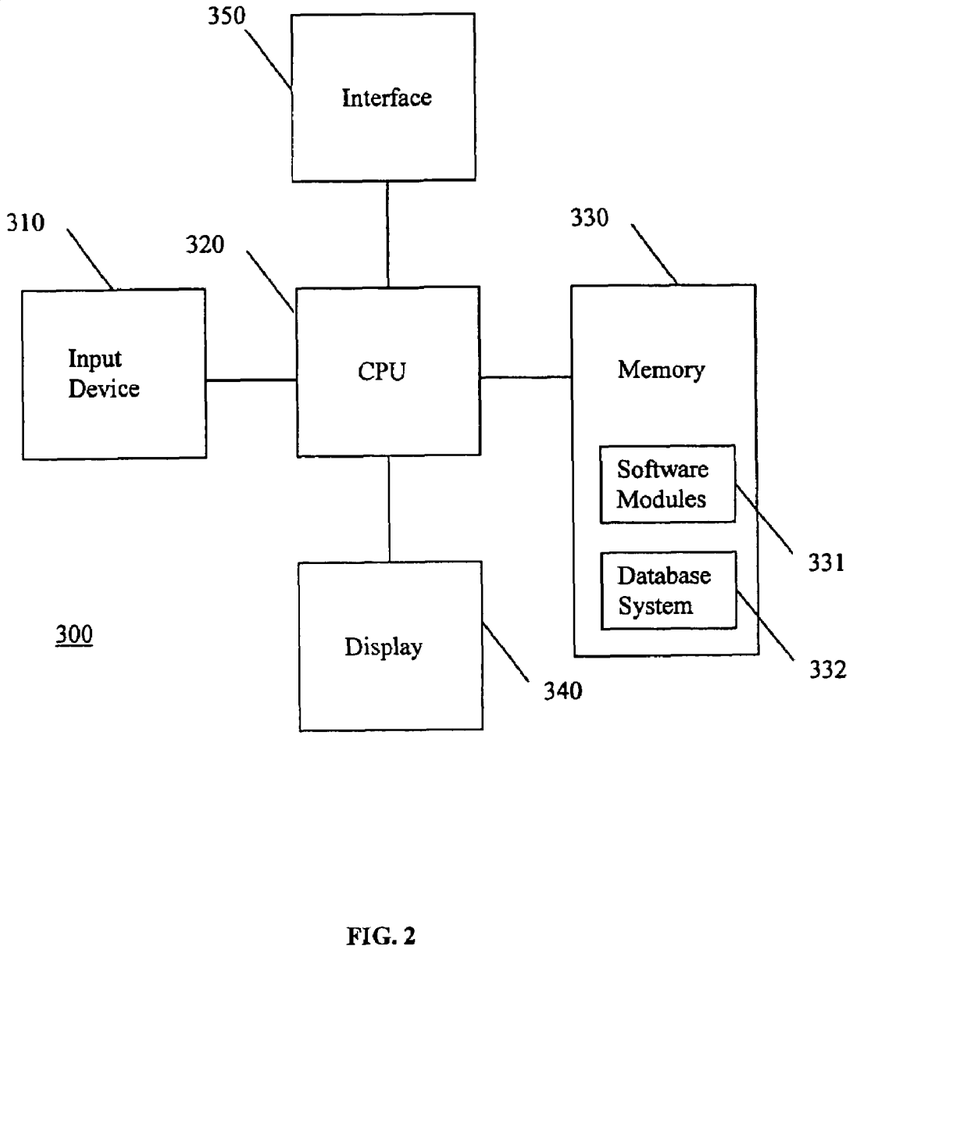
FIG. 2 is a block diagram illustrating a data processing system adapted to implement an embodiment of the invention; and, FIG. 3 is a flow chart illustrating operations of software modules within the memory of a data processing system for testing an internal bus of a random access memory ("RAM") device, the RAM device having an internal cache coupled to a memory array by the internal bus, in accordance with an embodiment of the invention.

FIG. 2 is a block diagram illustrating a data processing system 300 adapted to implement an embodiment of the invention. The data processing system 300 is suitable for testing a RAM device 100. The data processing system 300 includes a central processing unit ("CPU") 320, memory 330, and an interface device 350 and may optionally include an input device 310 and a display 340. The CPU 320 may include dedicated coprocessors and memory devices. The memory 330 may include RAM, ROM, disk devices, and databases. The interface device 350 may include means for providing access to the various inputs and outputs of the RAM device 100 to facilitate testing by the data processing system 300. The interface device 350 may be a printed circuit board ("PCB") on which the RAM device 100 is installed. The input device 310 may include a keyboard, a mouse, a trackball, or a similar device. And, the display 340 may include a computer screen, terminal device, or a hardcopy producing output device such as a printer or plotter. The data processing system 300 is adapted for communicating with other data processing systems (not shown) over a network (not shown) via a network interface device (not shown). The data processing system 300 may include a database system 332 for storing and accessing RAM device 100 and programming information. The database system 332 may include a database management system ("DBMS") and a database and is stored in the memory 330 of the data processing system 300. The data processing system 300 has stored therein data representing sequences of instructions which when executed cause the method described herein to be performed. Of course, the data processing system 300 may contain additional software and hardware a description of which is not necessary for understanding the invention.

Thus, the data processing system 300 includes computer executable programmed instructions for directing the system 300 to implement the embodiments of the present invention. The programmed instructions may be embodied in one or more software modules 331 resident in the memory 330 of the data processing system 300. Alternatively, the programmed instructions may be embodied on a computer readable medium (such as a CD disk or floppy disk) which may be used for transporting the programmed instructions to the memory 330 of the data processing system 300. Alternatively, the programmed instructions may be embedded in a computer-readable, signal or signal-bearing medium that is uploaded to a network by a vendor or supplier of the programmed instructions, and this signal or signal-bearing medium may be downloaded through an interface (e.g., a network interface) to the data processing system 300 from the network by end users or potential buyers.

According to one embodiment, the RAM device 100 may be indirectly connected to the CPU 320 via a field programmable gate array ("FPGA"), a complex programmable logic device ("CPLD"), an application-specific integrated circuit ("ASIC"), network processor, etc. In this case, the RAM test code logic may be implemented by the FPGA, CPLD, ASIC, network processor, etc., and the results may be reported to the CPU 320 rather than the CPU 320 exclusively performing the RAM test.

Now, existing RAM test methods do not account for internal caching 120 within RAM devices 100. In particular, existing RAM test methods do not have the write operations required for RAM devices 100 with internal caches 120. The present invention addresses this problem.

In a typical data bus test, a "1" is walked across each data bus 140 bit (or line) through a method similar to the following:

```
For (dataBusBit = 1; dataBusBit <= sizeOfBus; dataBusBit = dataBusBit
shifted left by 1
(e.g. 0x0001 becomes 0x0002 becomes 0x0004 becomes 0x0008, etc.)
{
    write the value of dataBusBit to address 0
    read the value at address 0
    if the value read at address 0 does not match dataBusBit then declare
    a failure
}
```

Thus, with this typical data bus test, the variable "dataBusBit" is first set to 1. The value of the dataBusBit variable is then written to address 0. Next, the value at address 0 is read. If the value read from address 0 is not equal to the value written to address 0 (i.e., dataBusBit=1), an error is reported as these two values should be equal. These steps are then repeated for each bit in the data bus 140, the data bus 140 having a size given by the variable "sizeOfBus".

With RAM devices containing internal caches, this test would test the interface 350 between the cache portion 120 of the RAM 100 and the processor 320 of the data processing system 300 (since all accesses to the RAM 100 occur at the same address), but it would not test the internal bus 160 within the RAM 100.

The present invention provides a method for testing the internal bus 160 within the RAM 100. According to one embodiment, to test the internal bus 160 within a RAM device 100 having an internal cache 120, the following method is used to walk a "1" across each data bus 140 bit (or line):

```
For (dataBusBit = 1; dataBusBit <= sizeOfBus; dataBusBit = dataBusBit
shifted left by 1
(e.g. 0x0001 becomes 0x0002 becomes 0x0004 becomes 0x0008, etc.)
{
    write the value of dataBusBit to address 0
    for (fillAddressLoop = 1; fillAddressLoop <=
    sizeOfInternalCacheInRAM;
    fillAddressLoop++)
    {
        write some value to address 0x100 * fillAddressLoop (note:
        addresses written to does not matter as long as none of them
        overwrite address 0 or end up in the same internal RAM cache)
    }
    read the value at address 0
    if the value read at address 0 does not match dataBusBit then declare
    a failure
}
```

Thus, with the data bus test of the present invention, the variable "dataBusBit" is first set to 1. The value of the dataBusBit variable is then written to address 0. Next, a variable "fillAddressLoop" is set to 1. A value is then written to an address other than address 0. This operation is then repeated the number of times required to fill the internal cache 120 of the RAM 110 hence pushing the value of the variable dataBusBit out of the internal cache 120 and into address 0 in the memory array 110. Next, the value at address 0 is read. If the value read from address 0 is not equal to the value written to address 0 (i.e., dataBusBit=1), an error is reported as these two values should be equal. These steps are then repeated for each bit in the data bus 140, the data bus 140 having a size given by the variable "sizeOfBus".

To further test the RAM device 100, the typical address bus test can be modified in a manner similar to the data bus test method of the present invention to test the internals of the RAM. The address bus test of the present invention is described below. Finally, after the address and data bus tests are complete, a non-repeating pattern can be written to the RAM 100 and verified followed by the inverse of this pattern. Note that after the last addresses are filled, additional writes are required to ensure that the data is flushed out of the RAM cache 120.

Recall that the purpose of data and address bus tests is to identify faults on the data and address buses 140, 130. An address/data bus works properly when each address/data bus bit operates independently of all other address/data bus bits and has a proper connection to the RAM device 100. Typical faults occur when one (or more) bits are either stuck high, stuck low, not connected (normally shows up as stuck high or low), or connected to another bit. A data bus test ensures that each data bus bit operates correctly (e.g., all data bits can independently be set high or low). Similarly, An address bus test ensures that each address bus bit operates correctly (e.g., all address bits can independently be set high or low).

According to one embodiment, the present invention provides an address bus test method for testing the internal bus 160 within the RAM 100. According to this embodiment, the following method is used:

```
Start Of Routine:
baseAddress = start of memory to test
firstFlushAddress = the start of a block of memory addresses used to flush the RAM's
internal cache 120. All addresses used must not be ones that the address bus test verifies
(i.e., these address are never read back).
pattern = 0xAA (Note that A hex = 1010 binary.)
antipattern = 0x55 (Note that 5 hex = 0101 binary, which is the inverse of 1010.)
// The pattern and antipattern allow for checking for address bits stuck high, stuck low, or
shorted.
Loop from addressOffset = 1 until addressOffset is larger than the memory size
    {
    Write pattern to the address resulting from baseAddress + addressOffset
    addressOffset = address offset << 1 (i.e., addressOffset goes from 0x01 to 0x02 to
    0x04 to 0x08, etc.) (It is a power of 2 offset.)
    }
Write antipattern to baseAddress
// flush the RAM's cache - note that an alternate method for picking addresses to flush the
cache with could be used
Loop from flushOffset = 0 while flushOffset is less than the number of internal cache
addresses in the RAM 100
    {
    Write antipattern to the address resulting from FlushAddress + flushOffset
    Increment flushOffset by one
    }
Loop from addressOffset = 1 until addressOffset is larger than the memory size
    {
    Read from the address resulting from baseAddress + addressOffset and put the result
    in dataRead
    If dataRead is not the same as pattern then
        {
        Indicate a failure and exit this routine
        }
    }
Write pattern to baseAddress
Loop from testOffset = 1 until testOffset is larger than the memory size
    {
    Write antiPattern to the address resulting from baseAddress + testOffset
    // Flush the RAM's cache - note that an alternate method for picking addresses to
    flush the cache with could be used
    Loop from flushOffset = 0 while flushOffset is less than the number of internal
    cache addresses in the RAM 100
        {
        Write antipattern to the address resulting from FlushAddress + flushOffset
        Increment flushOffset by one
        }
    Read from baseAddress and put the result in dataRead
    If dataRead is not the same as pattern then
        {
        Indicate a failure and exit this routine
        }
```

-continued

```
    Loop from addressOffset = 1 until addressOffset is larger than the memory size
    {
        If addressOffset is not the same as testOffset
        {
            Read from the address resulting from baseAddress + addressOffset
            and put the result in dataRead
            If dataRead is not the same as pattern then
            {
                Indicate a failure and exit this routine
            }
        }
    }
    Write pattern to the address resulting from baseAddress + testOffset
}
Return success
End of routine.
```

Thus, with the address bus test of the present invention, the variable "baseAddress" is first set to the address of start of the memory to test. In addition, the variable "firstFlushAddress" is set to the address of a block of memory addresses that will be used to flush RAM's internal cache 120. The addresses used to flush the RAM's internal cache must not be addresses used in the address bus test itself. The addresses used to test the address bus are baseAddress and baseAddress plus a value where a single address bit is set (i.e., 0x01, 0x02, 0x04, 0x08, 0x10, etc.), starting from the smallest addressable address. A pattern (e.g., 0xAA) is then written to each address from the baseAddress (plus an "addressOffset" of 1) to the end of the memory to be tested (using a line-by-line increment). An antipattern (e.g., 0x55) is written to baseAddress +0 first and then the cache is flushed by writing the antipattern to each address from the firstFlushAddress to the end of the cache memory. Note that other methods may be used to flush the cache. This pushes any pattern writes within the cache 120 into the memory array 110. For each address from baseAddress (plus an "addressOffset of 1) to the end of memory, the data is read to see if it is the same as the pattern data. If it is not, a failure is indicated. Then, the pattern is written to the baseAddress. If successful, the portion of the test ensures that no address line is stuck low or high.

Now, in order to detect if more than one address line is shorted to another address or data line, the address bus test continues as follows. An iteration is performed from baseAddress+testOffset, where the variable "testOffset" starts at 1 and does a line-by-line increment. For each iteration, the antipattern is written to baseAddress+testOffset and then the cache is flushed. Once the cache has been flushed, the baseAddress is read and is compared to the pattern data. If it is not the same as the pattern data, then a failure is indicated. Next all addresses from baseAddress+addressOffset are read, where addressOffset starts at 1 and goes through a line-by-line increment. The data read is compared to the pattern data. If it is not the same as the pattern data, a failure is indicated. This is only performed if addressOffset is not the same as testOffset since the data at this address is antipattern data and not pattern data. Pattern is then written to the baseAddress+testOffset and the iteration is completed. The next iteration is then started.

Advantageously, the PCB or interface 350 for the RAM 100 may be tested using the typical data and address bus test methods and the internal workings (i.e., the internal bus 160) of the RAM device 100 itself may be tested using the methods of the present invention. The present invention may thus be used to identify RAM failures for more complicated RAM devices. Without the proper RAM test coverage provided by the present invention, faulty PCBs may be released to customers. In addition, the present invention provides for a more focused fault assessment. This is an improvement over older RAM tests that often lead to the replacement of more parts than just the faulty RAM.

Figure 3:
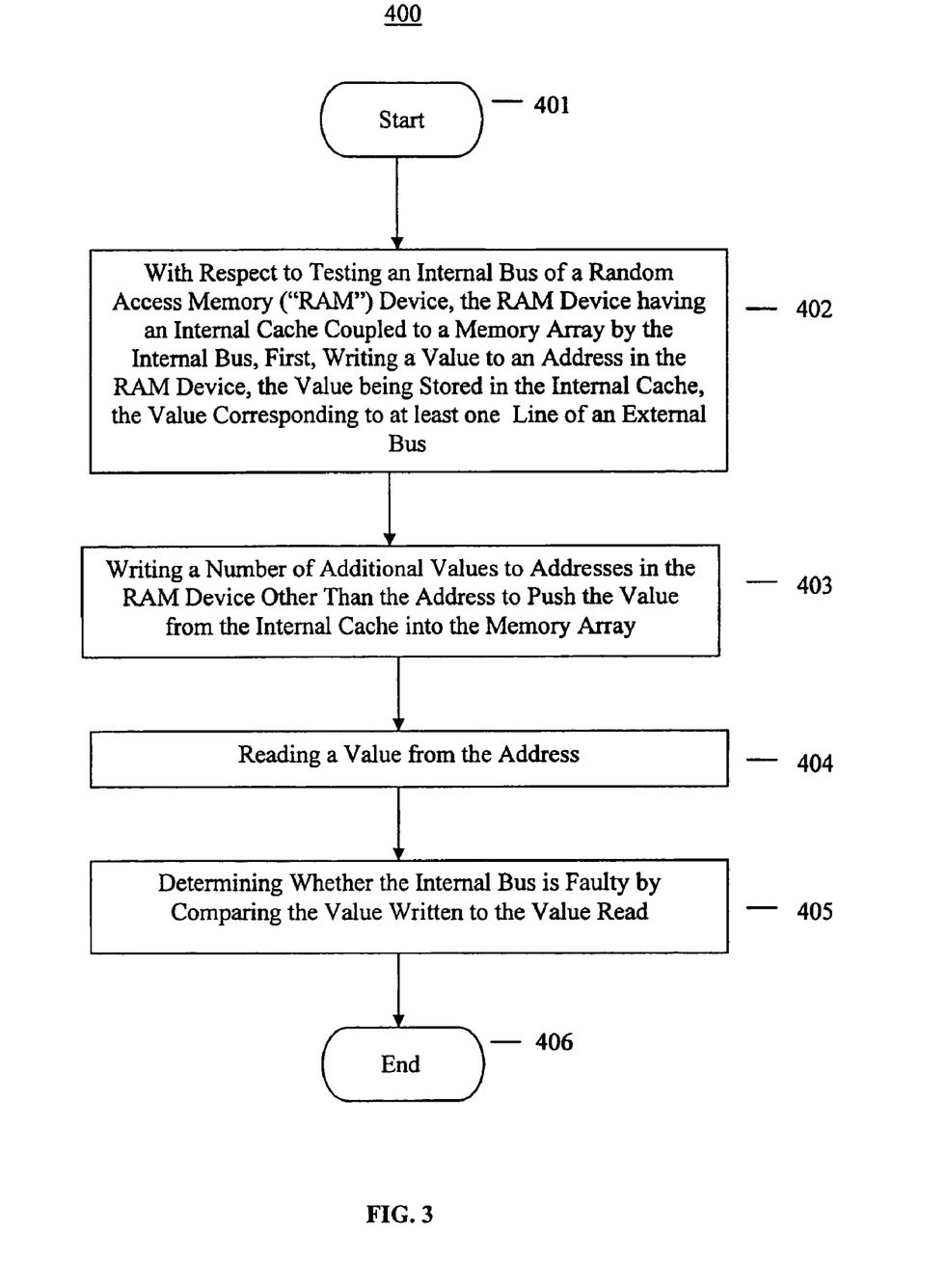

The above described method may be summarized with the aid of a flowchart. FIG. 3 is a flow chart illustrating operations 400 of software modules 331 within the memory 330 of a data processing system 300 for testing an internal bus 160 of a random access memory ("RAM") device, the RAM device 100 having an internal cache 120 coupled to a memory array 110 by the internal bus 160, in accordance with an embodiment of the invention.

At step 401, the operations 400 start.

At step 402, a value is written to an address in the RAM device 100, the value being stored in the internal cache 120, the value corresponding to at least one line of an external bus 130, 140.

At step 403, a number of additional values are written to addresses in the RAM device 100 other than the address to push the value from the internal cache 120 into the memory array 110.

At step 404, a value is read from the address.

At step 405, a determination is made as to whether the internal bus 160 is faulty by comparing the value written to the value read.

At step 406, the operations 400 end.

The method may further include repeating the writing of the value for each line of the external bus 130, 140. The external bus 130, 140 may be a data bus 140 and the value written to the address may be equal to binary 1, and may be incremented by a left shift for each line of the data bus 140, for determining whether lines of the data bus 140 are at least one of stuck high, stuck low, and shorted. The external bus 130, 140 may be an address bus 130 and the value written to the address may be a pattern for determining whether lines of the address bus 130 are at least one of stuck high, stuck low, and shorted. The value written to the address may be an antipattern being the inverse of the pattern. The number of additional values may correspond to a size of the internal cache 120. The RAM device 100 may be a dynamic RAM ("DRAM") device. The RAM device 100 may be a static RAM ("SRAM") device. The cache 120 may be a SRAM device and the memory array 110 may be a DRAM device. And, the RAM device 100 may be installed in a printed circuit board ("PCB").

While this invention is primarily discussed as a method, a person of ordinary skill in the art will understand that the apparatus discussed above with reference to a data processing system 300, may be programmed to enable the practice of the method of the invention. Moreover, an article of manufacture for use with a data processing system 300, such as a prerecorded storage device or other similar computer readable medium including program instructions recorded thereon, may direct the data processing system 300 to facilitate the practice of the method of the invention. It is understood that such apparatus and articles of manufacture also come within the scope of the invention.

In particular, the sequences of instructions which when executed cause the method described herein to be performed by the data processing system 300 of FIG. 2 can be contained in a data carrier product according to one embodiment of the invention. This data carrier product can be loaded into and run by the data processing system 300 of FIG. 2. In addition, the sequences of instructions which when executed cause the method described herein to be performed by the data processing system 300 of FIG. 2 can be contained in a computer software product according to one embodiment of the invention. This computer software product can be loaded into and run by the data processing system 300 of FIG. 2. Moreover, the sequences of instructions which when executed cause the method described herein to be performed by the data processing system 300 of FIG. 2 can be contained in an integrated circuit product including a coprocessor or memory according to one embodiment of the invention. This integrated circuit product can be installed in the data processing system 300 of FIG. 2.

The embodiments of the invention described above are intended to be exemplary only. Those skilled in this art will understand that various modifications of detail may be made to these embodiments, all of which come within the scope of the invention.

What is claimed is:

1. A method for testing an internal bus of a random access memory ("RAM") device, the RAM device having an internal cache coupled to a memory array by the internal bus, and the RAM device coupled to an external bus that provides data from a plurality of addresses to both the internal cache and the memory array, the method comprising the following steps:
    writing a first value to a first address in the RAM device, the first value being stored in the internal cache, the first value corresponding to at least one line of the external bus;
    writing a number of additional values to addresses in the RAM device other than the first address to fill the internal cache and thereby push the first value from the internal cache into the first address in the memory array;
    reading a second value from the first address of the memory array;
    determining whether the internal bus is faulty by comparing the first value written to the internal cache to the second value read from the memory array; and
    reporting an error when the first value is not equal to the second value.

2. The method of claim 1, further comprising the following step:
    repeating the writing of the first value for each line of the external bus.

3. The method of claim 2,
    wherein the external bus is a data bus and the first value written to the first address in the RAM device is equal to binary 1, and is incremented by a left shift for each line of the data bus, for determining whether said line is stuck high, stuck low, or shorted.

4. The method of claim 2,
    wherein the external bus is an address bus and the first value written to the first address in the RAM device is a pattern for determining whether lines of the address bus are at least one of stuck high, stuck low, and shorted.

5. The method of claim 4,
    wherein the first value written to the first address in the RAM device is an antipattern being the inverse of the pattern.

6. The method of claim 1,
    wherein the number of additional values corresponds to a size of the internal cache.

7. The method of claim 1,
    wherein the RAM device is a dynamic RAM ("DRAM") device.

8. The method of claim 1,
    wherein the RAM device is a static RAM ("SRAM") device.

9. The method of claim 1,
    wherein the cache is a SRAM device and the memory array is a DRAM device.

10. The method of claim 1,
    wherein the RAM device is installed in a printed circuit board ("PCB").

11. A system for testing an internal bus of a random access memory ("RAM") device, the RAM device having an internal cache coupled to a memory array by the internal bus and the RAM device coupled to an external bus that provides data from a plurality of addresses to both the internal cache and the memory array, the system comprising:
    a processor coupled to the RAM device through an interface; and
    a program executed by the processor, the program including:
        a module for writing a first value to a first address in the RAM device, the first value being stored in the internal cache, the first value corresponding to at least one line of the external bus;
        a module for writing a number of additional values to addresses in the RAM device other than the first address to fill the internal cache and thereby push the first value from the internal cache into the first address in the memory array;
        a module for reading a second value from the first address of the memory array;
        a module for determining whether the internal bus is faulty by comparing the first value written to the internal cache to the second value read from the memory array; and
        a module that reports an error when the first value is not equal to the second value.

12. The system of claim 11 and further comprising:
a module for repeating the writing of the first value for each line of the external bus.

13. The system of claim 12,
    wherein the external bus is a data bus and the first value written to the first address in the RAM device is equal to binary 1, and is incremented by a left shift for each line of the data bus, for determining whether said line is stuck high, stuck low, or shorted.

14. The system of claim 12,
    wherein the external bus is an address bus and the first value written to the first address in the RAM device is a pattern for determining whether lines of the address bus are at least one of stuck high, stuck low, and shorted.

15. The system of claim 14, wherein the first value written to the first address in the RAM device is an antipattern being the inverse of the pattern.

16. The system of claim 11, wherein the number of additional values corresponds to a size of the internal cache.

17. The system of claim 11, wherein the RAM device is a dynamic RAM ("DRAM") device.

18. The system of claim 11, wherein the RAM device is a static RAM ("SRAM") device.

19. The system of claim 11, wherein the cache is a SRAM device and the memory array is a DRAM device.

20. The system of claim 11, wherein the RAM device is installed in a printed circuit board ("PCB").

* * * * *